(12) United States Patent
Mukohara

(10) Patent No.: US 11,985,767 B2
(45) Date of Patent: May 14, 2024

(54) TAPE FEEDER

(71) Applicant: FUJI CORPORATION, Chiryu (JP)

(72) Inventor: Takaji Mukohara, Toyota (JP)

(73) Assignee: FUJI CORPORATION, Chiryu (JP)

( * ) Notice: Subject to any disclaimer, the term of this patent is extended or adjusted under 35 U.S.C. 154(b) by 848 days.

(21) Appl. No.: 17/046,181

(22) PCT Filed: Apr. 10, 2018

(86) PCT No.: PCT/JP2018/014998
§ 371 (c)(1),
(2) Date: Oct. 8, 2020

(87) PCT Pub. No.: WO2019/198140
PCT Pub. Date: Oct. 17, 2019

(65) Prior Publication Data
US 2021/0161042 A1 May 27, 2021

(51) Int. Cl.
*H01K 13/00* (2006.01)
*H05K 13/02* (2006.01)

(52) U.S. Cl.
CPC .................. *H05K 13/02* (2013.01)

(58) Field of Classification Search
CPC ............................ H05K 13/02; H05K 13/0417
See application file for complete search history.

(56) References Cited

U.S. PATENT DOCUMENTS

| | | | |
|---|---|---|---|
| 10,905,040 B2 * | 1/2021 | Otsubo | H05K 13/0421 |
| 11,122,720 B2 * | 9/2021 | Morikawa | H05K 13/086 |
| 11,425,850 B2 * | 8/2022 | Hara | H05K 13/02 |
| 2017/0042073 A1 | 2/2017 | Nagasawa et al. | |

FOREIGN PATENT DOCUMENTS

| | | |
|---|---|---|
| EP | 0 789 508 A1 | 8/1997 |
| JP | 2013-65802 A | 4/2013 |
| JP | 2016-28452 A | 2/2016 |
| JP | 2017-34171 A | 2/2017 |
| WO | WO 2015/181959 A1 | 12/2015 |

OTHER PUBLICATIONS

International Search Report dated Jul. 3, 2018 in PCT/JP2018/014998 filed on Apr. 10, 2018 citing documents AA and AQ-AR therein, 1 page.

* cited by examiner

*Primary Examiner* — Paul D Kim
(74) *Attorney, Agent, or Firm* — Oblon, McClelland, Maier & Neustadt, L.L.P.

(57) ABSTRACT

There is provided a tape feeder for feeding a taped component, in which multiple electric components are taped to a tape having engagement holes formed at equal pitches, to a supply position by engaging feeding claws with the engagement holes, including: a claw member that linearly moves in a state of being engaged with the engagement hole and feeds the taped component toward the feeding claw.

5 Claims, 8 Drawing Sheets

TAPE FEEDER

TECHNICAL FIELD

The present application relates to a tape feeder for feeding a taped component in which multiple electric components are taped to a tape in which engagement holes are formed at equal pitches to a supply position by engaging feeding claws with the engagement holes.

BACKGROUND ART

As described in the following Patent Literatures, a tape feeder usually includes a feeding claw for feeding the taped component toward the supply position by engagement with the engagement hole.

PATENT LITERATURE

Patent Literature 1: International Publication No. 2015/181959

Patent Literature 2: JP-A-2013-65802

BRIEF SUMMARY

Technical Problem

In a tape feeder having a feeding claw, a taped component is fed toward a supply position by the feeding claw. Therefore, it is necessary to set the tape feeder in a state where the taped components are fed to the feeding claw of the tape feeder. Here, an object of the present disclosure is to appropriately set a tape feeder in a state where a taped component is fed to a feeding claw of the tape feeder.

Solution to Problem

In order to solve the above-described problem, the present specification discloses a tape feeder for feeding a taped component, in which multiple electric components are taped to a tape having engagement holes formed at equal pitches, to a supply position by engaging feeding claws with the engagement holes, including: a claw member that linearly moves in a state of being engaged with the engagement hole and feeds the taped component toward the feeding claw.

Advantageous Effects

According to the present disclosure, as the claw member in a state of being engaged with the engagement hole moves linearly, the taped component is fed to the feeding claw of the tape feeder. Accordingly, it is possible to appropriately set the taped components in the tape feeder.

DESCRIPTION OF EMBODIMENTS

Hereinafter, as exemplary embodiments of the present disclosure, examples of the present disclosure will be described in detail with reference to the drawings.

Figure 1:
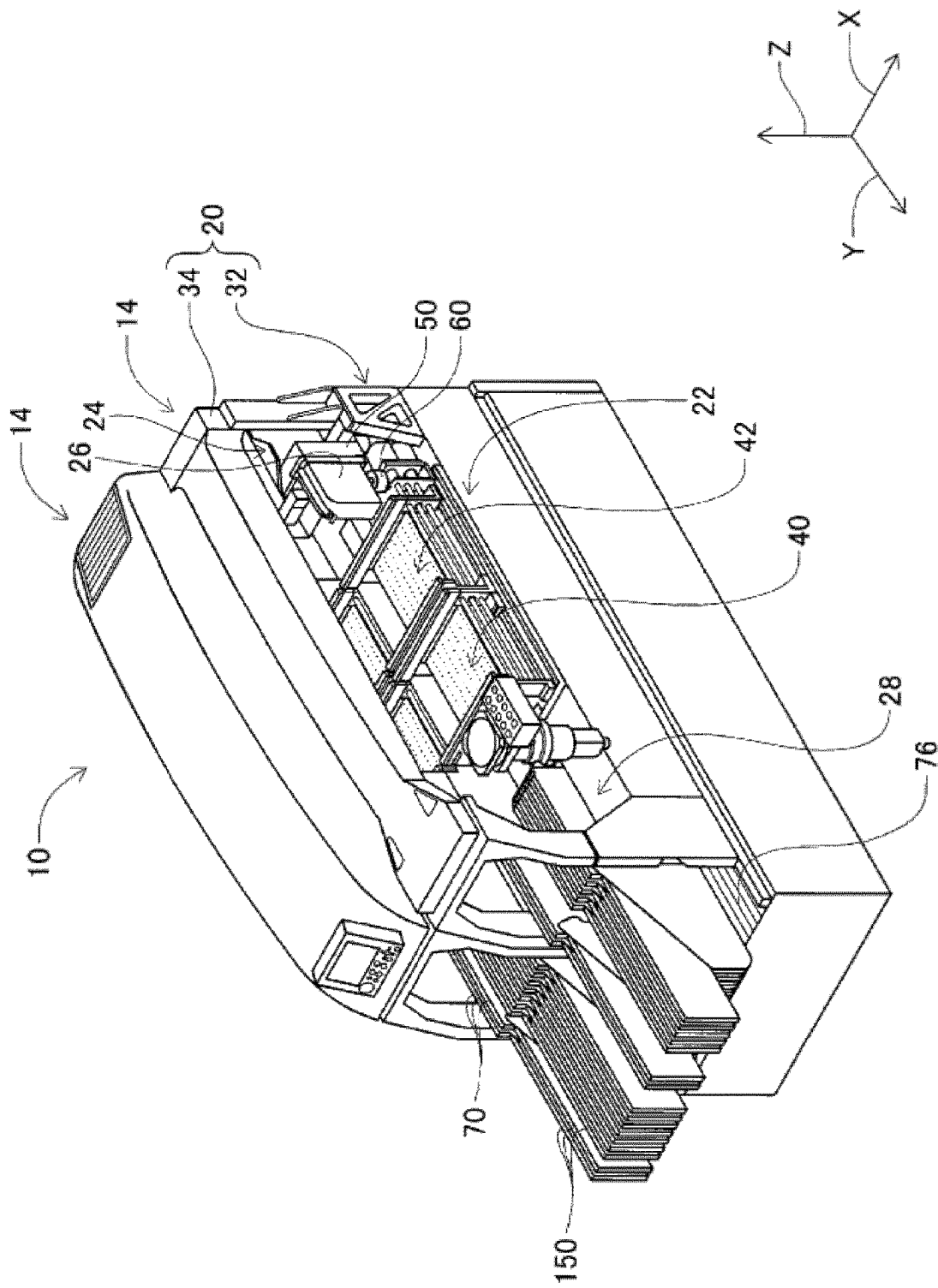
FIG. 1 is a perspective view illustrating an electronic component mounting device.

FIG. 1 illustrates electronic component mounting device 10. Electronic component mounting device 10 is composed of two electronic component mounting machines (hereinafter, there is a case of being abbreviated as "mounting machines") 14. Each mounting machine 14 mainly includes mounting machine main body 20, conveyance device 22, moving device 24, mounting head 26, and supply device 28.

Mounting machine main body 20 is composed of frame section 32 and beam section 34 overlaid on frame section 32. Conveyance device 22 includes two conveyor devices 40 and 42. Each of two conveyor devices 40 and 42 conveys a circuit board supported by each of conveyor devices 40 and 42. In the following description, the conveyance direction of the circuit board is referred to as the X direction, the horizontal direction perpendicular to the direction is referred to as the Y direction, the vertical direction is referred to as the Z direction.

Moving device 24 is an XY-robot type moving device and moves slider 50 to any position. In addition, as mounting head 26 is attached to slider 50, mounting head 26 is moved to any position on frame section 32. Mounting head 26 has suction nozzle 60 provided on the lower end face thereof. Suction nozzle 60 picks up and holds the electronic component by a negative pressure, and detaches the held electronic component by a positive pressure.

Mounting head 26 mounts the electronic component to the circuit board. Suction nozzle 60 is provided on the lower end face of mounting head 26. Suction nozzle 60 communicates with a positive and negative pressure supply device (not illustrated) via a negative pressure air passage and a positive pressure air passage. Accordingly, suction nozzle 60 picks up and holds the electronic component by a negative pressure, and detaches the held electronic component by a positive pressure. In addition, mounting head 26 has a nozzle lifting and lowering device (not illustrated) for lifting and lowering suction nozzle 60 and changes the position in the up-down direction of the electronic component to be held.

Figure 2:
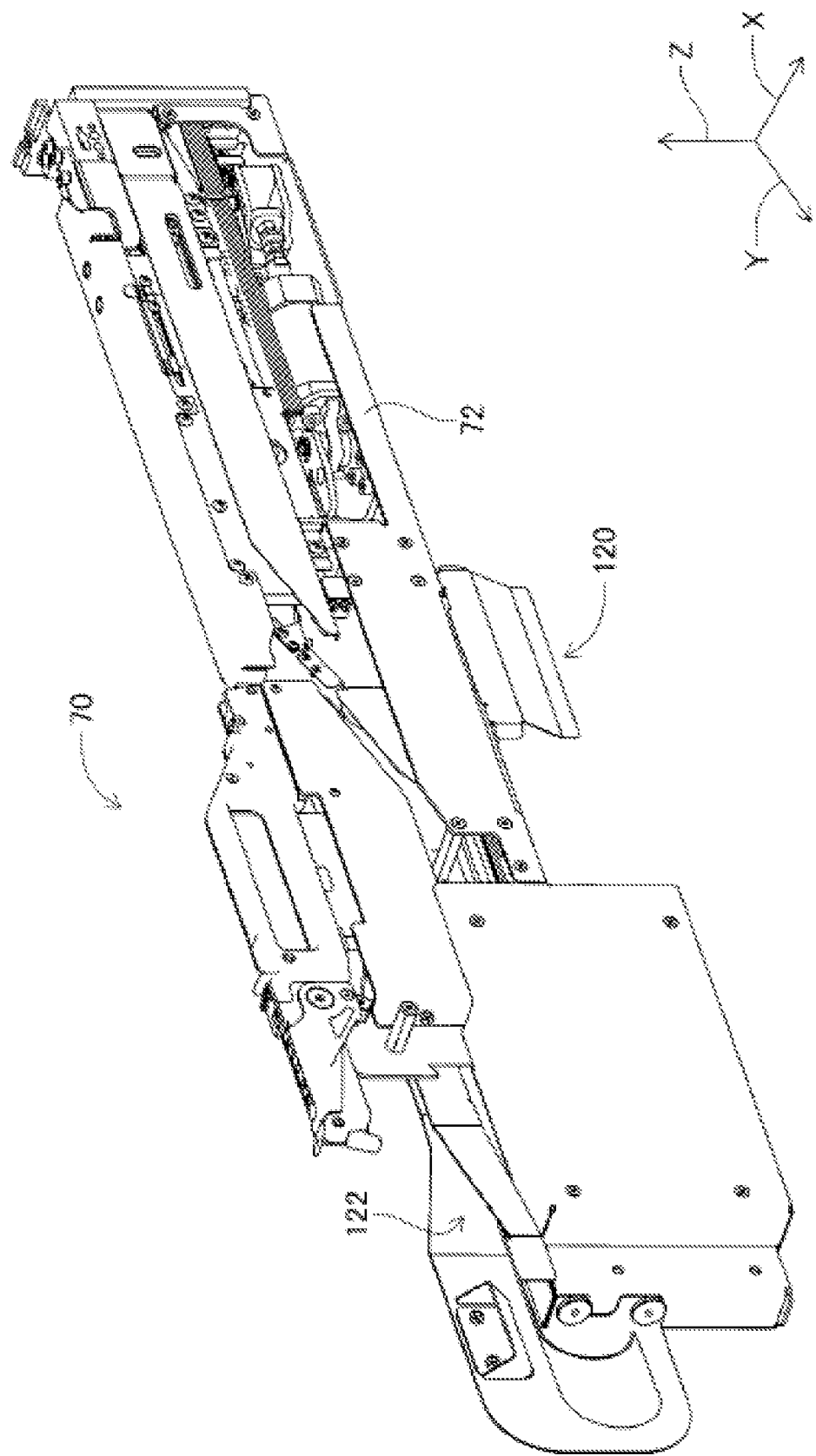
FIG. 2 is a perspective view of a tape feeder.

Supply device 28 is a device that has multiple tape feeders 70 and supplies components by each tape feeder 70. As illustrated in FIG. 2, tape feeder 70 includes feeder main body section 72 and is detachably mounted on mounting table (refer to FIG. 1) 76 provided at the end portion of frame section 32 in feeder main body section 72. In addition, on mounting table 76 of frame section 32, various tape feeders are mounted, but tape feeder 70 of the present application is a device that removes the radial lead component from the taped component (hereinafter, abbreviated as "radial component"), and supplies the removed radial component. The detailed structure of tape feeder 70 is described in "Japanese Patent Application No. 2017-147458" filed by the applicant of the present specification. Therefore, the structure of tape feeder 70 will be briefly described.

Figure 3:
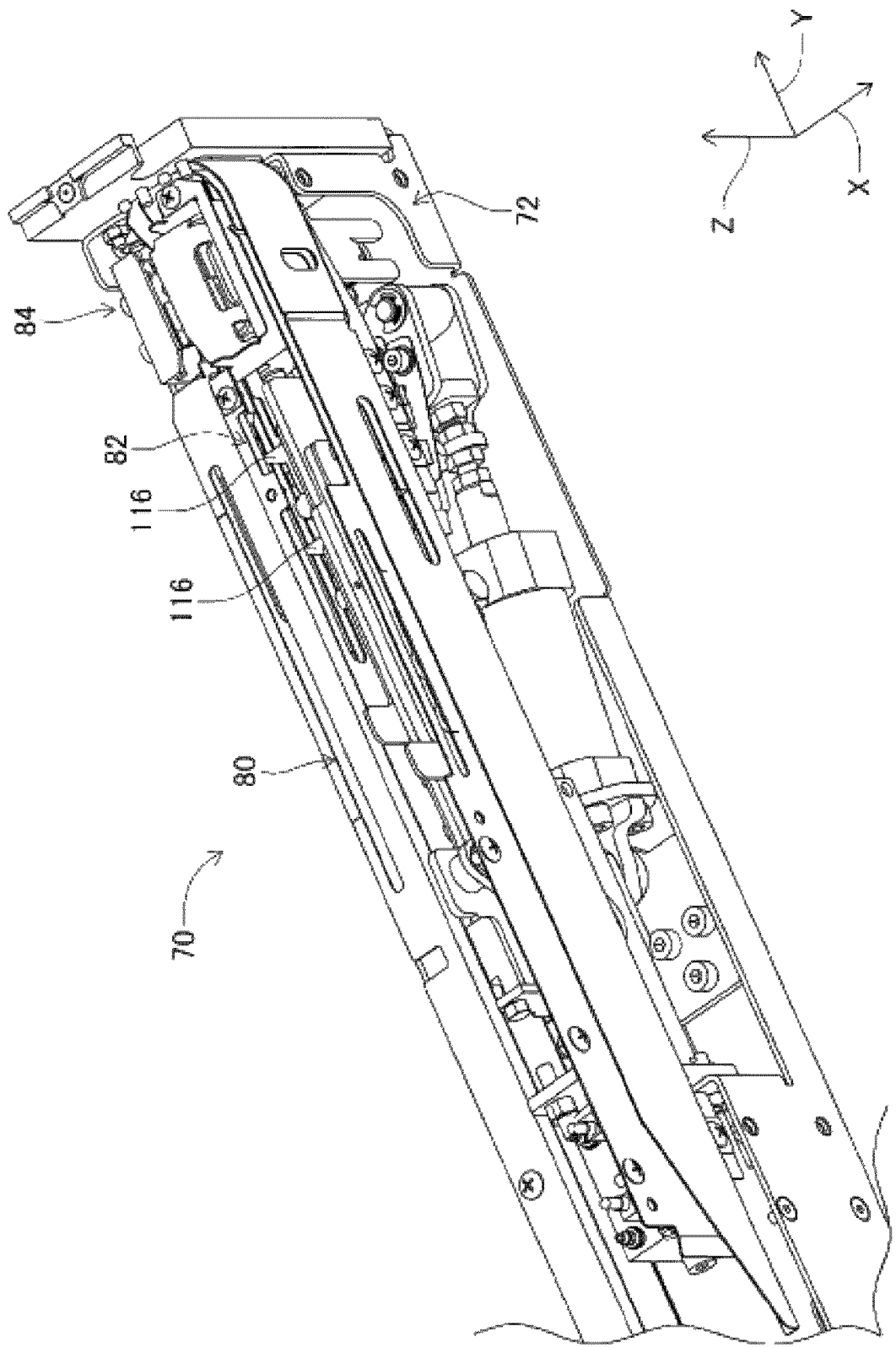
FIG. 3 is an enlarged perspective view of the tape feeder.

As illustrated in FIG. 3, tape feeder 70 has tape guide 80, feed device 82, and cutting device 84, and tape guide 80, feed device 82, and cutting device 84 are disposed on the inside of feeder main body section 72 which is a housing of tape feeder 70. In the description of tape feeder 70, there is a case where the side on which cutting device 84 is disposed is described as the front side, and the side opposite to the front side is described as the rear side.

Figure 4:
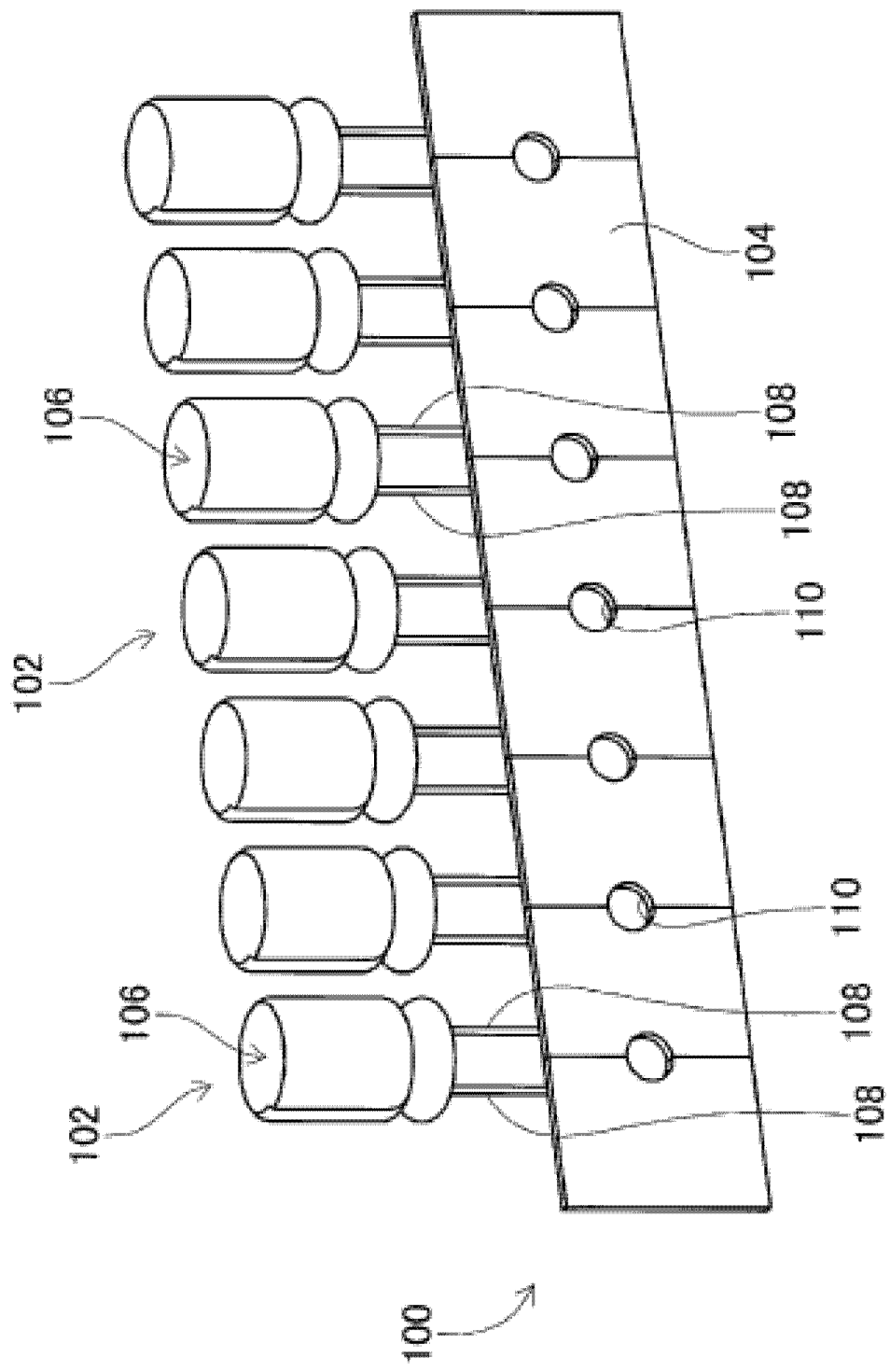
FIG. 4 is a perspective view of a taped component.

As illustrated in FIG. 4, taped components 100 are configured with multiple radial components 102 and carrier tape 104. Each radial component 102 includes generally cylindrical main body section 106 and two leads 108 extending out in the same direction from the bottom face of main body section 106. The two leads 108 of each radial component 102 are taped to carrier tape 104 at the lower end portion thereof. Carrier tape 104 has multiple feeding holes 110 formed at equal pitches. Multiple radial components 102 are taped to carrier tape 104 at the same pitch as the pitch at which feeding holes 110 are formed.

Tape guide 80 guides carrier tape 104 of taped component 100 in an upright state, and from the upper end portion of tape guide 80, radial component 102 taped to carrier tape 104 extends upward. In addition, tape guide 80 is a U-shaped path, and after extending toward the front side of tape feeder 70, at the front end portion of tape feeder 70, tape guide 80 is curved 180 degrees and extends toward the rear side of tape feeder 70.

Feed device 82 has multiple claw members 116, and is disposed in a path toward the front side of tape guide 80. In addition, in a state where multiple claw members 116 are engaged with feeding holes 110 of carrier tape 104 guided by tape guide 80, by sliding forward, taped components 100 are fed forward.

At the front end portion of tape feeder 70, cutting device 84 is disposed immediately before tape guide 80 is bent 180 degrees. In addition, cutting device 84 cuts lead 108 of radial component 102 taped to carrier tape 104 of taped component 100 fed by feed device 82, and supplies radial component 102 separated from carrier tape 104 in a state of holding radial component 102. Further, carrier tape 104 from which radial component 102 is separated by cutting device 84, that is, a so-called waste tape is rotated 180 degrees and fed rearward at the front end portion of tape feeder 70 along tape guide 80. Then, from discharge port (refer to FIG. 2) 120 formed at the center portion of tape feeder 70, the waste tape is discharged to the outside of tape feeder 70.

In this manner, in tape feeder 70, taped component 100 guided by tape guide 80 is guided by feed device 82 toward the supply position of the component. In addition, at the supply position, radial component 102 is cut from carrier tape 104 by cutting device 84, and supplied in a state of being held. In other words, in the path of tape guide 80, by engaging claw member 116 of feed device 82 with feeding hole 110 of taped component 100, due to the operation of feed device 82, taped component 100 is fed inside tape guide 80, and at the supply position, radial component 102 is supplied sequentially. Therefore, taped component 100 is allowed to enter the inside of tape guide 80, and it is necessary that claw member 116 of feed device 82 is engaged with feeding hole 110 of taped component 100.

Therefore, in the related art, by inserting the end portion of taped component 100 from opening (refer to FIG. 2) 122 of tape guide 80 formed at the rear end portion of tape feeder 70 and pushing taped component 100 to the inside of tape guide 80, the operator engages claw member 116 of feed device 82 with feeding hole 110 of taped component 100. In other words, until the end portion of taped component 100 inserted from opening 122 of tape guide 80 reaches feed device 82 in the path of tape guide 80, the operator pushes taped component 100 and engages claw member 116 with feeding hole 110 of taped component 100.

However, tape feeder 70 is mounted on mounting table 76, and in a relatively narrow region, it is necessary to push taped component 100 into the inside of tape feeder 70, and it is difficult to work. In particular, on mounting table 76, as illustrated in FIG. 1, there are cases where many tape feeders 70 are mounted, and thus, the work becomes work in an extremely narrow region, and the efficiency is extremely low. In addition, due to the work in a narrow region, when pushing taped component 100 into the inside of tape feeder 70, there is also a concern that taped component 100 is bent and radial component 102 taped to taped component 100 is damaged. In particular, when bending taped component 100, there is a case where lead 108 taped to taped component 100 is bent, and when bending lead 108, there is a concern that radial component 102 cannot be appropriately supplied at the supply position of tape feeder 70.

Figure 5:
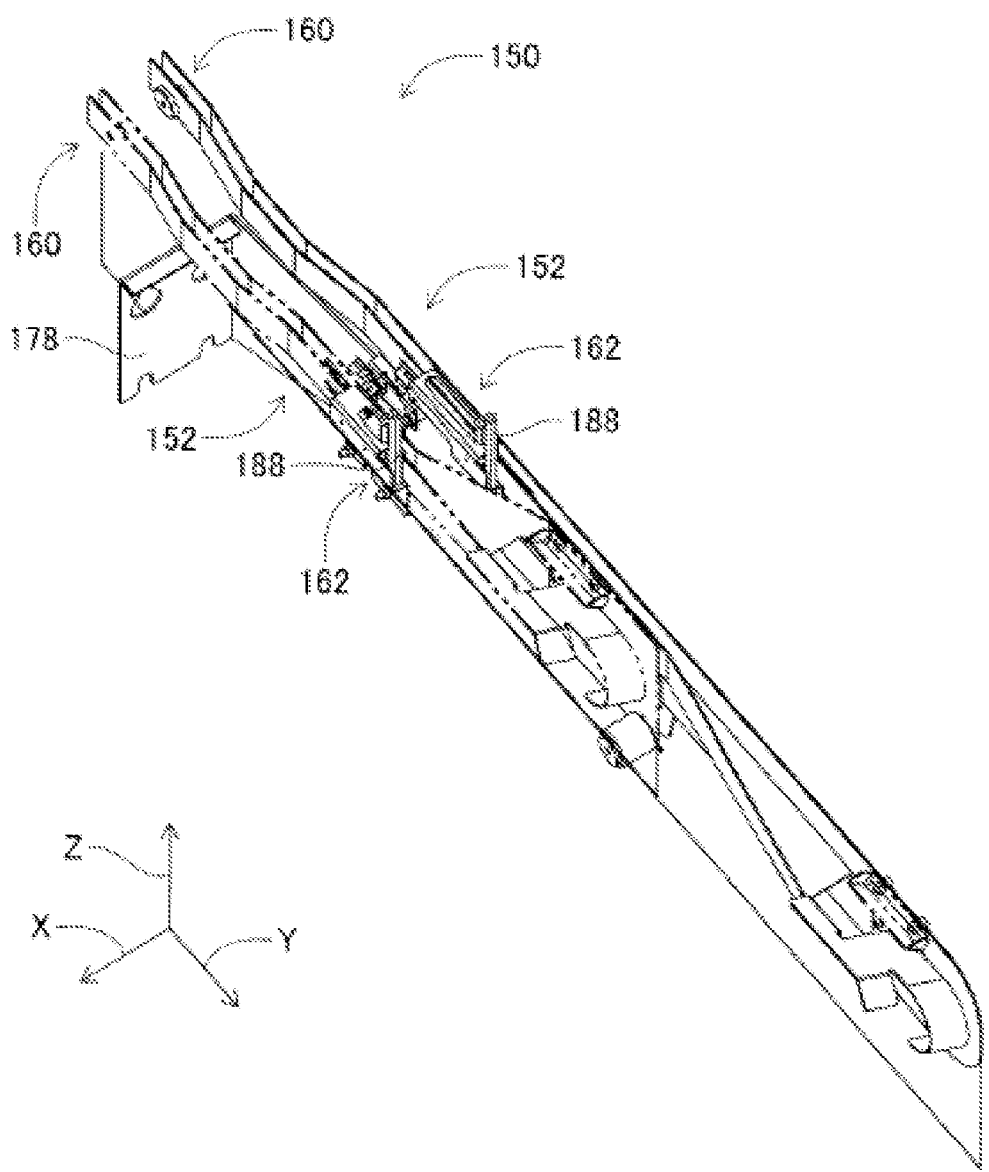
FIG. 5 is a perspective view of a tape setting device.

In view of this, tape feeder 70 includes tape setting device 150 illustrated in FIG. 5, and tape setting device 150 is coupled to the rear end portion of tape feeder 70. Tape setting device 150 is composed of two feed work machines 152, and two feed work machines 152 are disposed side by side in the X direction at a posture extending in the Y direction. One feed work machine 152 is a work machine that corresponds to one tape feeder 70 and sets taped component 100 to corresponding tape feeder 70. In other words, one tape setting device 150 is coupled to the rear end portions of two tape feeders 70 with one touch. In addition, there is a case where the side coupled to tape feeder 70 of tape setting device 150 is described as the front side and the opposite side of the front side is described as the rear side.

Figure 6:
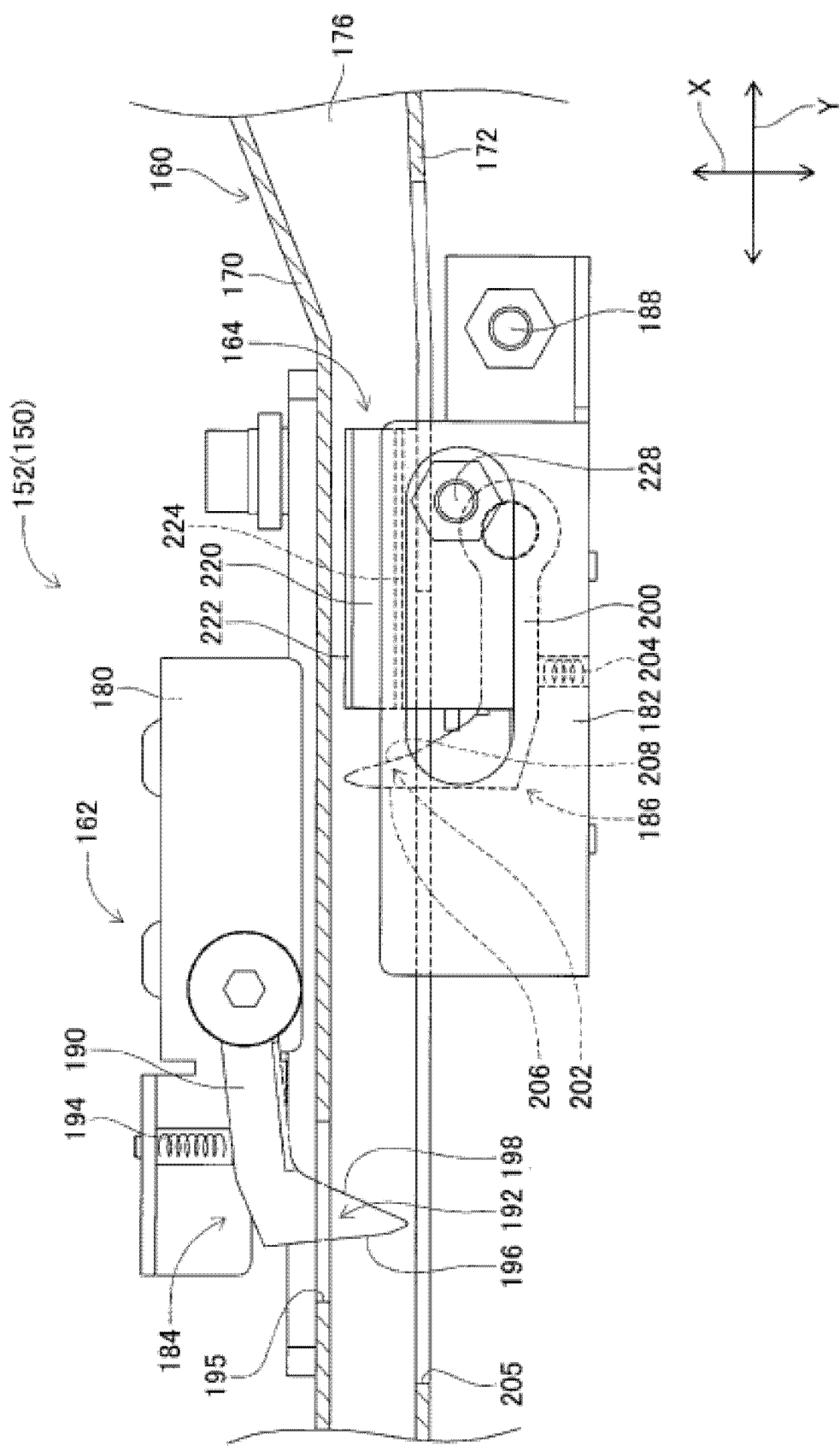
FIG. 6 is an enlarged view of a feed work machine.

As illustrated in FIG. 6, each feed work machine 152 includes guide frame 160, feed-out mechanism 162, and release mechanism 164. Guide frame 160 is composed of one pair of side walls 170 and 172 and bottom plate 176. In an upright state, one pair of side walls 170 and 172 oppose each other across a predetermined dimension (approximately several mm), and are disposed in a posture extending in the Y direction. In addition, the space between one pair of side walls 170 and 172 is closed at the lower end portion by bottom plate 176.

In addition, as illustrated in FIG. 5, at the front end portion, guide frame 160 of two feed work machines 152 is integrated by bracket 178, bracket 178 fits round holes for coupling to a bolt protruding section of the rear end portion of tape feeder 70, and accordingly, tape setting device 150 is coupled to the rear end portion of tape feeder 70. Further, in a state where tape setting device 150 is coupled to the rear end portion of tape feeder 70, the tip end portion of guide frame 160 of feed work machine 152 faces opening 122 of the rear end of tape guide 80 of tape feeder 70 corresponding to feed work machine 152.

In addition, as illustrated in FIG. 6, feed-out mechanism 162 includes fixing bracket 180, slide bracket 182, return preventing claw member 184, and feed claw member 186. Fixing bracket 180 is fixed to one side wall 170 of one pair of side walls 170 and 172 in a posture extending in the Y direction. Meanwhile, slide bracket 182 is slidably disposed on the other side wall 172 of one pair of side walls 170 and 172 in the Y direction in a posture extending in the Y direction. In addition, at the rear end portion of slide bracket 182, feed handle 188 extending upward is fixed, the operator grips and moves feed handle 188 in the front-rear direction, and slide bracket 182 slides linearly along side wall 172. In addition, slide bracket 182 is slidable within a range in which the front side from a position opposing fixing bracket 180 is the front end and the rear side from the position opposing fixing bracket 180 is the rear end.

Further, return preventing claw member 184 is generally L-shaped and is composed of main body section 190 and bent portion 192 bent approximately 90 degrees with respect to main body section 190. Return preventing claw member 184 is disposed on fixing bracket 180 in a posture in which main body section 190 extends in the front-rear direction and bent portion 192 faces forward. In addition, return preventing claw member 184 has a posture in which the tip end of bent portion 192 faces side wall 170.

Further, at the end portion on the rear side of main body section 190, return preventing claw member 184 is swingably held in the left-right direction (the direction in which the claw enters and exits with respect to the inside of guide frame 160) by fixing bracket 180, and is biased in the direction approaching side wall 170 by compression coil spring 194. Then, on side wall 170, at the position opposing bent portion 192 of return preventing claw member 184, slit 195 is formed, and bent portion 192 of return preventing claw member 184 which is biased by compression coil spring 194 enters the inside of guide frame 160, that is, the space between one pair of side walls 170 and 172 through slit 195.

Incidentally, the surface on the front side of bent portion 192 of return preventing claw member 184 to enter the inside of guide frame 160 is a surface perpendicular to main body section 190, but the surface on the rear side of bent portion 192 is a taper surface facing rearward as approaching main body section 190. Therefore, the surface on the front side of bent portion 192 is described as perpendicular surface 196, and the surface on the rear side of bent portion 192 is described as taper surface 198.

In addition, feed claw member 186 has substantially the same shape as that of return preventing claw member 184, and is composed of main body section 200 and bent portion 202 similarly to return preventing claw member 184. Feed claw member 186 is disposed on slide bracket 182 in a posture in which main body section 200 extends in the front-rear direction and bent portion 202 faces forward. In addition, feed claw member 186 has a posture in which the tip end of bent portion 202 faces side wall 172.

Further, at the end portion on the rear side of main body section 200, feed claw member 186 is swingably held in the left-right direction by slide bracket 182, and is biased in the direction approaching side wall 172 by compression coil spring 204. Then, on side wall 172, at the position opposing bent portion 202 of feed claw member 186, slit 205 is formed, and bent portion 202 of feed claw member 186 which is biased by compression coil spring 204 enters the inside of guide frame 160 through slit 205. Incidentally, the length dimension of the slit 205 in the front-rear direction is a length dimension corresponding to the slide range of slide bracket 182. Therefore, even when slide bracket 182 slides, bent portion 202 of feed claw member 186 and side wall 172 are prevented from abutting against each other.

Incidentally, the surface on the front side of bent portion 202 of feed claw member 186 to enter the inside of guide frame 160 is a surface perpendicular to main body section 200, but the surface on the rear side of bent portion 202 is a taper surface rearward as approaching main body section 200. Therefore, the surface on the front side of bent portion 202 is described as perpendicular surface 206, and the surface on the rear side of bent portion 202 is described as taper surface 208.

In addition, release mechanism 164 is composed of support plate 220 and one pair of slide plates 222 and 224. Support plate 220 is slidably held in the front-rear direction by slide bracket 182 below feed claw member 186. Then, support plate 220 extends to the inside of guide frame 160 via slit 205 of side wall 172. Further, one pair of slide plates 222 and 224 oppose each other in a posture extending in the front-rear direction on the inside of guide frame 160, that is, the space between one pair of side walls 170 and 172, in a state of being upright on the upper surface of support plate 220.

Further, on support plate 220, release handle 228 extending upward is fixed, the operator grips and moves release handle 228 in the front-rear direction, and accordingly, one pair of slide plates 222 and 224 slide in the front-rear direction on the inside of guide frame 160. At this time, as one pair of slide plates 222 and 224 slide forward, the front end portion of slide plate 224 comes into contact with bent portion 202 of feed claw member 186, and as one pair of slide plates 222 and 224 slide rearward, the contact of slide plate 224 with feed claw member 186 is released.

With such a structure, in feed work machine 152, on the inside of guide frame 160, that is, the space between one pair of side walls 170 and 172, carrier tape 104 of taped component 100 is accommodated in an upright state. In addition, radial component 102 taped to carrier tape 104 extends upward from the upper end of side walls 170 and 172. In addition, a state where taped component 100 is upright is a state where carrier tape 104 perpendicularly intersects with the horizontal plane, and is a state where lead 108 taped on carrier tape 104 extends in the up-down direction. In this manner, as taped component 100 is upright, the width of feed work machine 152 can be narrowed. Further, feed claw member 186 and return preventing claw member 184 are engaged with feeding hole 110 of taped component 100 accommodated on the inside of guide frame 160. In addition, by the operation of the operator to feed handle 188, feed claw member 186 is slid in the front-rear direction, and accordingly, taped component 100 is fed toward feeding claw of tape feeder 70, and taped component 100 is set on tape feeder 70.

Specifically, taped component 100 is plugged from the rear end portion of guide frame 160, and is inserted into the inside of guide frame 160, that is, the space between one pair of side walls 170 and 172 and between one pair of slide plates 222 and 224 of release mechanism 164. Then, the tip end of bent portion 202 of feed claw member 186 extending to the inside of guide frame 160 through slit 205 is engaged with feeding hole 110 of carrier tape 104 of taped component 100 inserted between one pair of slide plates 222 and 224. Further, the tip end of bent portion 192 of return preventing claw member 184 extending to the inside of guide frame 160 through slit 195 is engaged with feeding hole 110 positioned on the front side of feeding hole 110 with which feed claw member 186 is engaged. In other words, feed claw member 186 and return preventing claw member 184 are engaged with two feeding holes 110 of taped component 100.

Then, in a state where feed claw member 186 and return preventing claw member 184 are engaged with two feeding holes 110 of carrier tape 104, by the operation to the front of feed handle 188, slide bracket 182 slides forward linearly. At this time, together with slide bracket 182, feed claw member 186 disposed on slide bracket 182 slides forward linearly, and taped component 100 is pushed forward by perpendicular surface 196 of bent portion 192 of feed claw member 186. Since perpendicular surface 196 is perpendicular to taped component 100, the force for pushing taped component 196 forward by perpendicular surface 196 is transferred to taped component 100 and taped component 100 is fed forward.

In addition, return preventing claw member 184 is also engaged with feeding hole 110 of taped component 100 fed forward by the slide of feed claw member 186, but when taped component 100 is fed, the engagement of return preventing claw member 184 is released. In particular, as taped component 100 is fed, bent portion 192 of return preventing claw member 184 engaged with feeding hole 110 is pushed forward by the edge portion defining feeding hole 110 on taper surface 198. Taper surface 198 is not perpendicular to taped component 100 and is tilted rearward as approaching the base end section of bent portion 192, that is, main body section 190. Therefore, the force for pushing taper surface 198 forward is dispersed in a force in the direction of separating bent portion 192 from taped component 100, and return preventing claw member 184 is against the elastic force of compression coil spring 194, and swings in a direction separated from taped component 100. Accordingly, when taped component 100 is fed forward by the slide of feed claw member 186, the engagement of return preventing claw member 184 with taped component 100 is released.

In this manner, by sliding slide bracket 182 forward by the operation to feed handle 188, taped component 100 is fed forward on the inside of guide frame 160. In addition, when slide bracket 182 slides to the front end of the slide range of slide bracket 182 and stops, the feeding of taped component 100 also stops. At this time, feeding hole 110 of taped component 100 of which the feeding is stopped, and the tip end of bent portion 192 of return preventing claw member 184 oppose each other. Therefore, bent portion 192 of return preventing claw member 184 is engaged with feeding hole 110 of taped component 100 of which the feeding is stopped, by the elastic force of compression coil spring 194. In other words, when the feeding of taped component 100 by the slide of feed claw member 186 is stopped, feed claw member 186 and return preventing claw member 184 are engaged with two feeding holes 110 of taped component 100.

Subsequently, after slide bracket 182 slides to the front end of the sliding range of slide bracket 182, the rearward operation of feed handle 188 causes slide bracket 182 to slide rearward. At this time, in taped component 100, the return to the direction opposite to the feeding direction is prevented by return preventing claw member 184, and the engagement of feed claw member 186 with feeding hole 110 is released.

Specifically, according to the rearward slide of slide bracket 182, feed claw member 186 also slides rearward, and at this time, bent portion 202 of feed claw member 186 engaged with feeding hole 110 pushes the edge portion defining feeding hole 110 rearward on taper surface 208. Therefore, the force for returning taped component 100 in the direction opposite to the feeding direction is transferred to taped component 100.

At this time, bent portion 192 of return preventing claw member 184 is engaged with feeding hole 110, and perpendicular surface 196 of bent portion 192 is pushed rearward by the edge portion defining feeding hole 110. However, since perpendicular surface 196 is perpendicular to taped component 100, the force for pushing perpendicular surface 196 is not dispersed in the left-right direction and return preventing claw member 184 does not swing. Therefore, the engagement of return preventing claw member 184 with feeding hole 110 is maintained, and the return of taped component 100 in the opposite direction to the feeding direction is prevented.

Further, taper surface 208 of bent portion 202 of feed claw member 186 is tilted rearward as approaching main body section 200. Therefore, when feed claw member 186 slides rearward, a reaction force by which taper surface 208 pushes the edge portion defining feeding hole 110 is generated in a direction in which bent portion 202 is separated from taped component 100. Accordingly, feed claw member 186 swings in the direction separated from taped component 100, the engagement of feed claw member 186 with feeding hole 110 is released. In addition, as sliding to the rear end of the slide range, feed claw member 186 is engaged with feeding hole 110 of taped component 100 after the feeding.

Accordingly, the return of taped component 100 in the opposite direction to the feeding direction is prevented, and feed claw member 186 is returned to the position before the feeding of taped component 100. In addition, again, as feed handle 188 is operated in the front-rear direction similarly to the above-described procedure, taped component 100 is fed forward. In this manner, each time feed handle 188 is operated sequentially in the front-rear direction, taped component 100 is fed by the amount corresponding to the sliding amount of slide bracket 182. Accordingly, only by operating feed handle 188 in the front-rear direction by the operator, it is possible to feed out taped component 100 to feed device 82 of tape feeder 70, and efficiency in a narrow work region is improved. Furthermore, it is possible to easily perform the work even in a narrow work region, and it is possible to prevent damage or the like of radial component 102 due to bending of taped component 100.

In addition, when taped component 100 is fed to the feeding claw of feed device 82 of tape feeder 70 by feed work machine 152, feed device 82 is operated, and taped component 100 is fed to the supply position by feed device 82. At this time, when return preventing claw member 184 and feed claw member 186 are engaged with feeding hole 110 in feed work machine 152, there is a concern that the feeding of taped component 100 by feed device 82 is hindered. Further, at the time of setup replacement, when replacing taped component 100, in feed work machine 152, when return preventing claw member 184 and feed claw member 186 are engaged with feeding hole 110, taped component 100 cannot be withdrawn from feed work machine 152.

Figure 7:
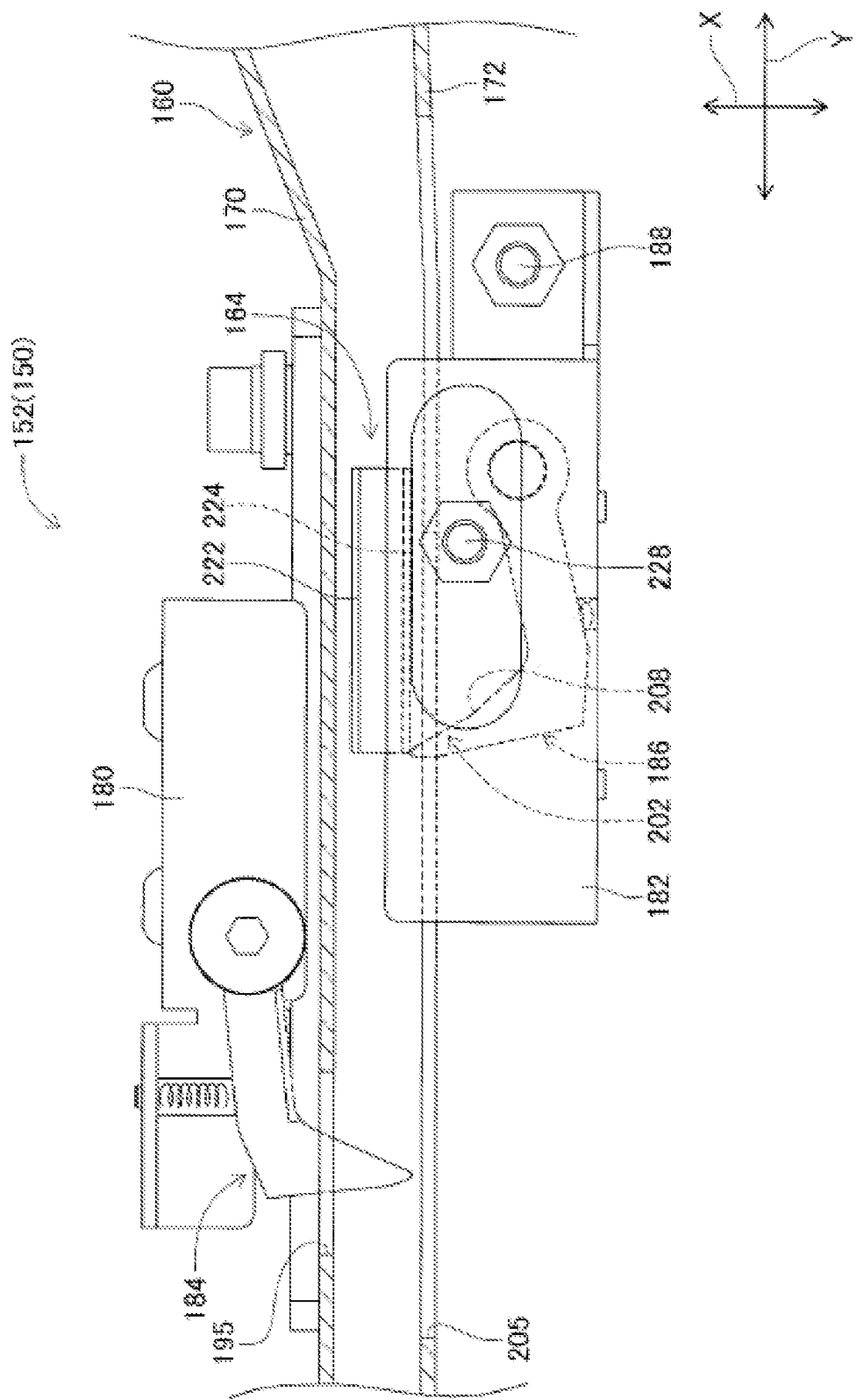
FIG. 7 is an enlarged view of the feed work machine.

Therefore, in feed work machine 152, the engagement of return preventing claw member 184 and feed claw member 186 with feeding hole 110 is released by release mechanism 164. Specifically, by the forward operation of release handle 228, one pair of slide plates 222 and 224 of release mechanism 164 slide forward. At this time, as illustrated in FIG. 7, the front end portion of slide plate 224 is in contact with bent portion 202 of feed claw member 186 extending to the inside of guide frame 160. Therefore, as taper surface 208 of bent portion 202 is pushed forward, the pushing force acts in a direction of separating bent portion 202 from slide plate 224, and feed claw member 186 swings in a direction of being separated from slide plate 224. Accordingly, the tip end of bent portion 202 of feed claw member 186 moves to the outside from between one pair of slide plates 222 and 224, and the engagement of feed claw member 186 with feeding hole 110 is released.

Figure 8:
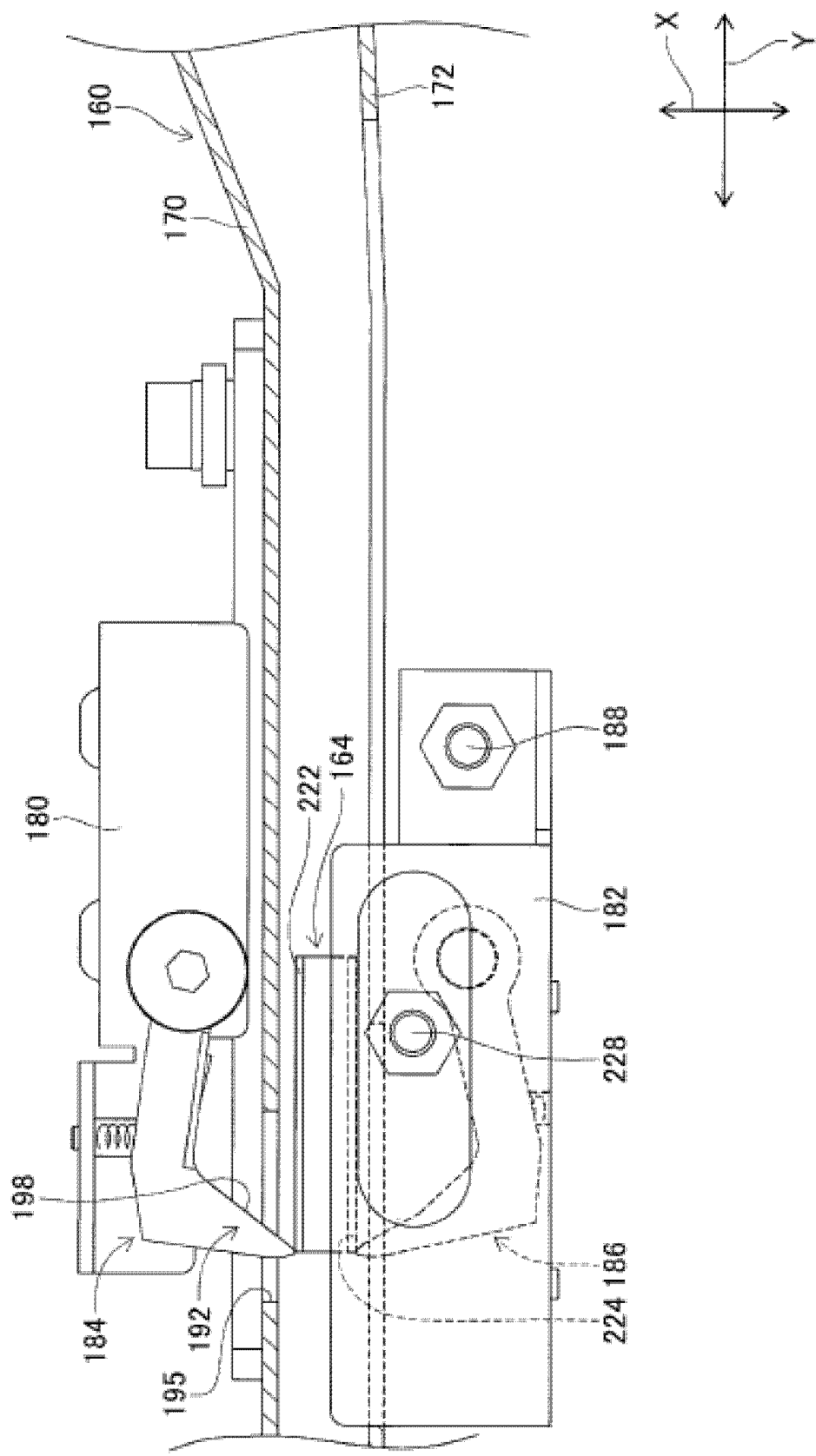
FIG. 8 is an enlarged view of the feed work machine.

Then, in a state where slide plates 222 and 224 slide forward, that is, in a state where slide plate 224 is in contact with bent portion 202 of slide bracket 182, by the forward operation of feed handle 188, slide bracket 182 slides forward. At this time, together with slide bracket 182, one pair of slide plates 222 and 224 also slides forward, and as illustrated in FIG. 8, the front end portion of slide plate 222 is in contact with bent portion 192 of return preventing claw member 184 extending to the inside of guide frame 160. Therefore, as taper surface 198 of bent portion 192 is pushed forward, the pushing force acts in a direction of separating bent portion 192 from slide plate 222, and return preventing claw member 184 swings in a direction of being separated from slide plate 222. Accordingly, the tip end of bent portion 192 of return preventing claw member 184 moves to the outside from between one pair of slide plates 222 and 224, and the engagement of return preventing claw member 184 with feeding hole 110 is released.

In this manner, in feed work machine 152, by operating release handle 228 and feed handle 188 forward, the engagement of return preventing claw member 184 and feed claw member 186 with feeding hole 110 is released. Accordingly, it is possible to ensure that tape feeder 70 appropriately feeds taped component 100 by feed device 82. In addition, it is possible to easily extract taped component 100 from feed work machine 152.

Further, in feed work machine 152, as a member that is engaged with feeding hole 110 of taped component 100 and feeds taped component 100, feed claw member 186 is employed, but instead of feed claw member 186, feed work machine that employs a sprocket is considered. In a feed work machine that employs such a sprocket, teeth at the outer peripheral portion of the sprocket are engaged with feeding holes 110 of taped component 100, and taped component 100 is fed by the rotation of the sprocket.

However, tape feeders 70, that is, many of the tape feeders other than the radial feeder for radial component 102, are fed not in a state where the taped component is upright, but in a state where the carrier tape of the taped component extends in the left-right direction, that is, in a state where the carrier tape and the horizontal plane are fed in a generally parallel state. In such a tape feeder, the sprockets are rotatably disposed around an axis extending in the left-right direction. In other words, the sprocket is disposed in a posture extending in the up-down direction.

Meanwhile, in tape feeder 70, taped component 100 is fed in a state of being upright. Therefore, even in the feed work machine, it is necessary to feed taped component 100 in an upright state, and in the feed work machine that employs a sprocket, the sprocket is rotatably disposed around the axis extending in the up-down direction. In other words, the sprocket is disposed in a posture extending in the left-right direction. In such a posture, when the sprocket is disposed, the dimension in the width direction of the feed work machine increases, and it is impossible to achieve a compact feed work machine.

Furthermore, in order to engage the teeth of the sprocket with feeding holes 110 of taped component 100 in an upright state, it is necessary that the teeth of the sprocket has a shape that can prevent falling off or the like from the feeding holes 110 rather than a simple shape for reliably engaging the teeth of the sprocket and the feeding hole 110 with each other. In view of this, in feed work machine 152, feed claw member 186 for engaging feeding hole 110 of taped component 100 slides linearly, and taped component 100 is fed by feed claw member 186. Accordingly, it is possible to suppress the dimension in the width direction of feed work machine 152, and to achieve compact feed work machine 152.

Tape feeder 70 is an example of a tape feeder. Taped component 100 is an example of a taped component. Radial component 102 is an example of an electronic component. Feeding hole 110 is an example of an engagement hole. Claw member 116 is an example of a feeding claw. Feed-out mechanism 162 is an example of a feed-out mechanism. Release mechanism 164 is an example of a release mechanism. Feed claw member 186 is an example of a claw member.

In addition, the present disclosure is not limited to the above-described example, and can be implemented in various aspects with various changes and improvements based on the knowledge of those skilled in the art. Specifically, for example, in the above-described example, tape feeder 70, that is, a radial feeder is employed, but it is possible to employ a tape feeder other than the radial feeder. Specifically, for example, the electronic component is accommodated in the recessed section formed in the carrier tape, and according to the taped component in which the recessed section is covered with the top tape, a tape feeder for supplying the electronic component, an axial feeder or the like can be employed.

Further, in the above-described example, for convenience, although tape setting device 150 is composed of two feed work machines 152, tape setting device 150 may be composed of one feed work machine 152 so as to correspond to each one tape feeder.

Further, in the above-described example, feed work machine 152 feeds taped component 100 manually, but may be configured to automatically feed taped component 100. In other words, the present disclosure may be applied to a feed work machine having an auto-loading function of a taped component. Specifically, for example, slide bracket 182 is configured to operate automatically by a driving source such as an electromagnetic motor, a cylinder, or the like. Further, when a detection sensor is disposed in the vicinity of feed device 82 of tape feeder 70, and claw member 116 of feed device 82 is fed to a position to be engaged with feeding hole 110 of taped component 100, taped component 100 is configured to detect by the detection sensor. In addition, by the operation of the driving source, slide bracket 182 slides, and taped component 100 is automatically fed toward the above-described position of feed device 82 of tape feeder 70. At this time, when taped component 100 is detected by the detection device, the operation of the driving source is stopped, and the feeding of taped component 100 is stopped. At this time, it is necessary that feed work machine 152 is detachably coupled to tape feeder 70, and is integrally configured with tape feeder 70. With such a configuration, the present disclosure can be employed as a tape feeder having an auto-loading function. In addition, the auto-loading function is a function of automatically feeding the taped components to the supply position where the tape feeder supplies the components when the taped components wound on the reels are mounted on the tape feeder.

REFERENCE SIGNS LIST

70: tape feeder, 100: taped component, 102: radial component (electronic component), 110: feeding hole, 116: claw member (feeding claw), 162: feed-out mechanism, 164: release mechanism, 186: feed claw member (claw member)

The invention claimed is:

1. A tape feeder for feeding a taped component, in which multiple electric components are taped to a tape including engagement holes formed at equal pitches, comprising:
    feeding claws that feed the tape to a supply position of the tape feeder by engaging with the engagement holes;
    a tape guide that guides the tape from an upstream opening of the tape feeder to the feeding claws; and
    a claw member that linearly moves in a state of being engaged with at least one of the engagement holes and feeds the taped component through the opening, along the tape guide and toward the feeding claws.

2. The tape feeder according to claim 1, wherein the claw member is slid linearly and manually.

3. The tape feeder according to claim 1, further comprising a release mechanism that releases engagement of the claw member with the at least one of the engagement holes.

4. The tape feeder according to claim 3,
wherein the release mechanism automatically releases the engagement of the claw member with the at least one of the engagement holes when the taped component is fed to a position where the taped component is engaged with the feeding claws by movement of the claw member.

5. The tape feeder according to claim 1,
wherein the tape feeder includes a feed-out mechanism that includes the claw member and linearly moves the claw member, and
wherein the feed-out mechanism is detachably mounted to face the opening of the tape feeder.

* * * * *